United States Patent [19]

Gerhart et al.

[11] Patent Number: 4,847,577

[45] Date of Patent: Jul. 11, 1989

[54] SECURITY AND ALARM SYSTEM EMPLOYING A PARTICULAR PULSE WIDTH DISCRIMINATOR

[76] Inventors: Roland T. Gerhart, 4000 Grondinwood La., Milford, Mich. 48082; J. Carroll Hill, 134 Rosswood Dr., PeWee Valley, Ky. 40056

[21] Appl. No.: 121,675

[22] Filed: Nov. 17, 1987

Related U.S. Application Data

[62] Division of Ser. No. 756,475, Jul. 18, 1985, Pat. No. 4,724,425.

[51] Int. Cl.[4] .............................................. H03K 5/153

[52] U.S. Cl. .................................... 328/111; 307/234; 307/518; 340/539; 375/22

[58] Field of Search ............... 307/510, 517, 518, 234; 328/111, 136, 138, 140

[56] References Cited

U.S. PATENT DOCUMENTS

| | | | |
|---|---|---|---|
| 3,943,382 | 3/1976 | Hermansdorfer et al. | 328/138 |
| 4,112,317 | 9/1978 | Everswick . | |
| 4,211,982 | 7/1980 | Smith | 328/140 |
| 4,247,823 | 1/1981 | Vun Kannon, Jr. . | |
| 4,535,297 | 1/1984 | Puckette . | |

OTHER PUBLICATIONS

E. E. Pearson, "One-Shot/Flip-Flop Pairs Detect Frequency Bands" Electronics, Apr. 24, 1972, p. 104.

*Primary Examiner*—John Zazworsky
*Attorney, Agent, or Firm*—Flynn, Thiel, Boutell & Tanis

[57] ABSTRACT

A security and alarm apparatus has a pulse width discriminator circuit which includes: a monostable multivibrator having a trigger input connected to a data input of a flip-flop, a data output connected to a clock input of the flip-flop, and a pulse width control input; and a pulse width control circuit connected to the pulse width control input which causes a pulse produced by the monostable multivibrator to have one width when the flip-flop is in a first state and a larger width when the flip-flop is in a second state, the flip-flop producing at its data output a signal which is a logic high voltage when the frequency of an input signal at the trigger input has exceeded a first predetermined frequency and until it thereafter falls below a second predetermined frequency less than said first predetermined frequency, and which is a logic low voltage when the input signal has fallen below the second predetermined frequency until the input signal again exceeds the first predetermined frequency. The apparatus includes a plurality of sensors which can each detect an alarm condition, a radio transmitter which transmits a detected alarm condition to a radio receiver having an output connected to the trigger input, and an arrangement producing a display in response to the output of the flip-flop.

6 Claims, 6 Drawing Sheets

SECURITY AND ALARM SYSTEM EMPLOYING A PARTICULAR PULSE WIDTH DISCRIMINATOR

FIELD OF THE INVENTION

This invention relates to a security and alarm system and, more particularly, to a security and alarm system capable of detecting a variety of hazardous situations that might reasonably occur in a home or industrial property, such as theft, fire, heart attack, and the like, capable of signaling the occurrence of such conditions to other parties, and utilizing a sophisticated coding scheme for reliably transmitting an indication of the alarm condition over noisy communications channels, such as those available on citizens band radios.

BACKGROUND OF THE INVENTION

Home security systems of various types have previously been developed. These systems use one or more sensors to detect one or more alarm conditions, such as an intruder, a fire, a drop in temperature due to a furnace failure, and so forth. These prior systems typically actuate an audible alarm, the purpose of which is to scare away any intruder, warn all persons present of the alarm condition, and to warn other persons in the immediate vicinity of the alarm condition. However, if there is no one in the building and if persons in the immediate vicinity do not hear and respond to the alarm, the system is rendered ineffective. For this reason, some prior systems have also been provided with a device which, when triggered, will automatically dial the police or a security service, but an intruder can defeat these systems by cutting the telephone lines to the building prior to entering the building. One approach to overcoming these problems, in particular with respect to making neighbors or other persons in the vicinity aware of an alarm condition, is to provide a system which can communicate with other systems in nearby buildings using radio waves, for example over citizens band channels, since citizens band transceivers are readily available at relatively low cost.

The Federal Communications Commission (FCC) has set aside 40 channels for citizens band radios, of which 6 can be used for coded signals such as radio control applications. Since the FCC made these channels available to the general public without examination requirements, there has been a great interest in using these channels for control and signaling purposes ranging from simple transmitter identification schemes to rather complex systems like those used for the remote control of model airplanes, boats, and cars. As a simple example, a person might like to avoid hearing the continual verbal chatter that is normally present on the typical citizens band channel by having a device connected to his receiver that would only permit an audio output when his receiver receives a unique signal transmitted specifically to him, for example by his neighbor or his spouse. The receiving station, although continually receiving radio signals generated by the transmitting station of interest and also all other citizens band stations within range, would thus product an audible output only when another transmitting station emitted the requisite unique signal. The person at the receiving end would then be called upon to listen to the extremely noisy conditions that prevail on the usual citizens band channel only when the person at the transmitting end was trying to reach him, rather than continuously.

Although such arrangements are easy to imagine, the situation is quite different in practice, because of a number of legal and physical restrictions imposed on citizens band systems.

First, unlimited Radio Frequency power is not available, because the Federal Communication Commission limits the RF power of a citizens band transceiver to 4 watts (except on one channel 23, which can be used with up to 25 watts). With simple antennas, this restricts the range of such systems to approximately five miles.

Second, the Federal Communications Commission forbids internal adjustment and modification of citizens band transceivers except by holders of the appropriate class of FCC license, and restricts rather severely the adjustments and modifications even those persons may make. In particular, modifications to increase power output and/or to change the modulation techniques are illegal. Consequently, a security and alarm system using citizens band transceivers would have to inject signals into an unmodified citizens band transceiver in the normal way, namely through the microphone input, and since citizens band transceivers are designed to accept voice signals in the audio range, the injected signals would have to be in that range of frequencies, for example from 300 Hz to 3000 Hz.

Third, the above-mentioned restrictions on internal modifications to citizens band devices would also limit the security and alarm system to observing the audio output of the receiver, which may not reproduce the waveform of a transmitted signal with great accuracy. In fact, only sinusoidal signals may be counted on to come through with a reasonably faithful degree of reproduction, due to the narrow audio bandwidth of the transceiver.

Fourth, the citizens band channels are continually filled with other interfering signals which are in themselves legal, since they originate from other licensed stations transmitting voice signals. Since these other transmitters are often mobile stations, the signals received are often very strong. Attempting to receive information from a station five miles away while a transmitter fifty feet away is transmitting is a challenging task, because the strong signals from the nearby transmitter will typically capture the automatic gain control loop of the receiver and thus suppress the signal from the remote transmitter.

These interfering signals can in a sense be referred to as "noise", and one might think that their effects can be readily overcome, because noise suppression and filtering techniques are highly developed and are widely used in the scientific, engineering, and radio communications field. However, the "noise" on the citizens band channels is quite different from the noise that communications technology can suppress, in that it is highly variable in intensity and spectral content with respect to time. That is, the citizens band "noise" is "nonstationary", whereas "stationary" noise has statistical properties such as amplitude distribution and power spectral density that do not change with time. Accordingly, it is far more accurate to think of the interfering signals as "jamming" signals which are highly variable in amplitude, frequency, and pattern of occurrence.

One approach to solving these problems is to start with a simple audio oscillator generating a precisely known frequency in the audio range, for example 1 KHz. This signal is in the passband of the typical citizens band transceiver, and will be transmitted as though it were a normal voice signal. At the receiving end, the 1 KHz signal will be received (if the interfering signals are sufficiently weak), and may be passed through a filter designed to pass only a narrow range of frequencies centered on 1 KHz. The output of this filter will be large only if a 1 KHz signal is being received, and could be taken as an indication that the transmitting station of interest was transmitting. A relay could then be closed, allowing the audio output of the receiver to reach an external loudspeaker or other form of audible alarm, thus enabling the person at the receiving end to hear what was being transmitted.

Many such simple systems have been designed and marketed. They do not work well, however, for the simple reason that normal speech patterns contain substantial amounts of energy in the frequency range surrounding 1 KHz, and this energy causes the narrow band filter to frequently respond to voice signals in exactly the same way that it would respond to the enabling signal from the transmitting station of interest.

An approach to improving the situation would be to pick a better frequency or use narrower filter bandwidths. Because of the restricted bandwidth of the CB transceiver, however, there aren't any frequencies significantly better, and as the receiving filter bandwidth is made narrower, it becomes technologically difficult to make sure that the transmitter and receiver are aligned to the same audio frequency.

Another approach is to use combinations of two or more frequencies transmitted simultaneously or sequentially in an attempt to make the triggering signal sufficiently different from voice signals so that the receiver may reliably tell the two apart. Many attempts have been made in this direction, but none have produced entirely satisfactory results. The problem of reducing the probability of a false alarm to sufficiently low levels while keeping the probability of detecting a true alarm sufficiently high for the system to fulfill its intended purpose is thus difficult. Utilizing relatively simple electronics, it is very hard to generate signals significantly different from those appearing as normal background chatter on the citizens band channels; female voices are particularly likely to trigger such devices with great regularity, due to their strong high frequency content.

SUMMARY OF THE INVENTION

Objects and purposes of the invention are met by providing an apparatus having a pulse width discriminator including: a D-type flip-flop having a data input, a clock input, and a data output; a monostable multivibrator having a trigger input connected to the data input of the flip-flop, a data output connected to the clock input of the flip-flop, and a pulse width control input; and a pulse width control circuit connected to the pulse width control input of the monostable multivibrator for determining the width of a pulse produced by the monostable multivibrator when an input signal applied to the trigger input actuates the monostable multivibrator, the clock input of the flip-flop being responsive to the trailing edge of each pulse from the monostable multivibrator, the pulse width control circuit means including a hysteresis circuit for causing a pulse produced by the monostable multivibrator to have a first width when the flip-flop is in its first state and to have a second width slightly greater than the first width when the flip-flop is in its second state; wherein when an AC input signal is applied to the trigger input of the monostable multivibrator, the flip-flop produces at its data output an output signal which is a logic high voltage when the frequency of the input signal has exceeded a first predetermined frequency and until the frequency of the input signal thereafter falls below a second predetermined frequency which is less than the first predetermined frequency, and which is a logic low voltage when the input signal has fallen below the second predetermined frequency until the input signal again exceeds the first predetermined frequency.

According to a further feature the apparatus includes a radio receiver having an output connected to the trigger input of the monostable multivibrator.

According to yet a further feature, the apparatus also includes plural sensors which are each adapted to detect an alarm condition; an arrangement for monitoring the sensors to determine whether or not any sensor has detected an alarm condition; a radio transmitting arrangement for transmitting in response to detection of an alarm condition by any sensor a radio signal which includes a message identifying the detected alarm condition, the radio receiver receiving the radio signal, and the message being embodied in the AC input signal produced at the output of the radio receiver; and an arrangement responsive to the data output of the flip-flop for providing one of an audio and a visual indication of the receipt of the message.

BRIEF DESCRIPTION OF THE DRAWINGS

A complete understanding of the invention and its features and advantages will become apparent from the following detailed description, taken in conjunction with the accompanying drawings, wherein.

DETAILED DESCRIPTION

For convenience, a brief overview of the system will be given prior to a detailed explanation of the various parts thereof.

Figure 1:
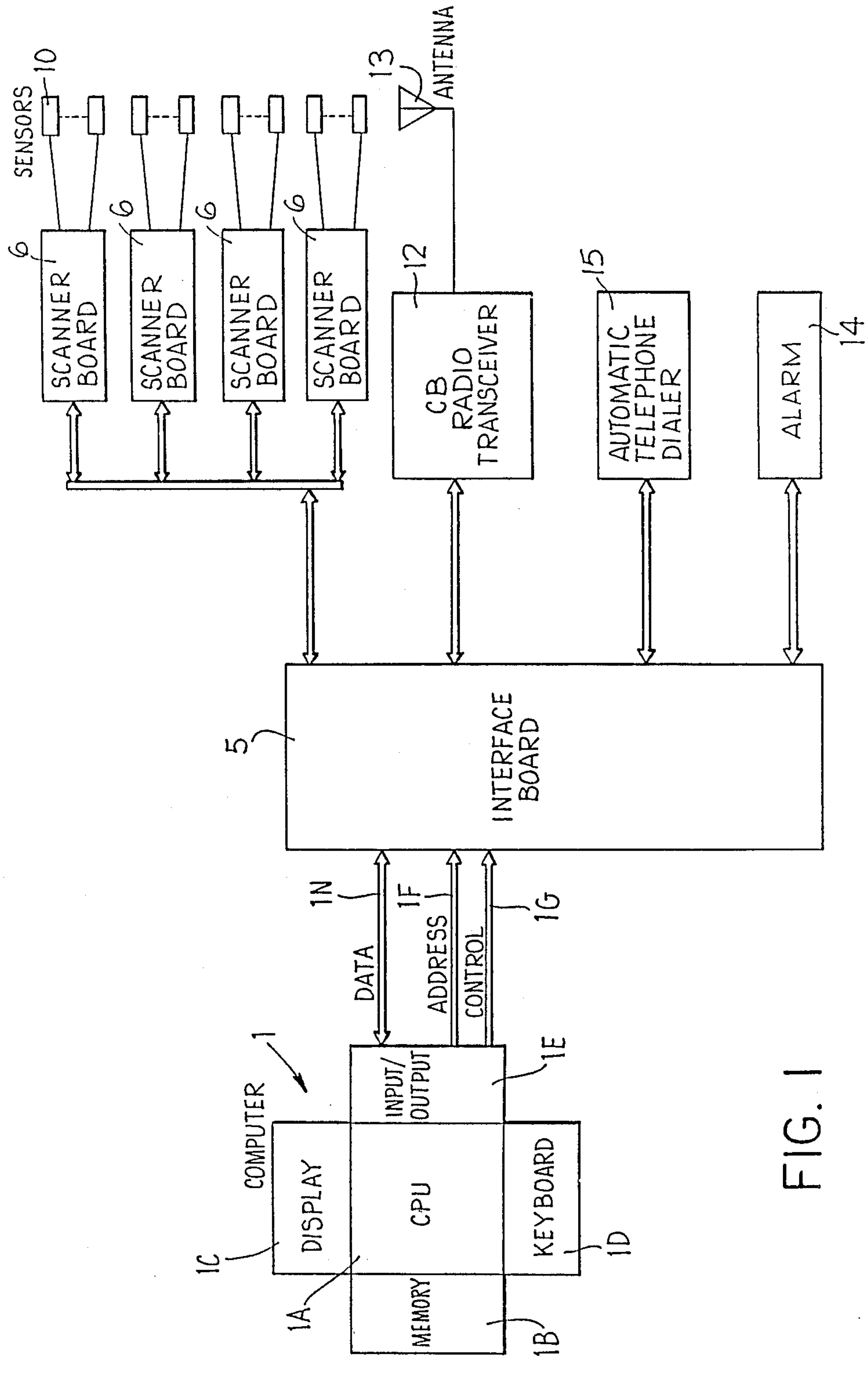
FIG. 1 is a schematic block diagram of a security and alarm system embodying the present invention.

With reference to FIG. 1, there is shown a security and alarm system which includes a computer 1. The computer 1 includes a CPU 1A, memory 1B, video display 1C, keyboard 1D and input/output control 1E. The computer 1 is a conventional, commercially available device and is therefore not described in detail. In the preferred embodiment, the computer 1 is a Radio Shack TRS-80 Model III.

Computer 1 exchanges digital signals with an interface board 5 using address lines 1F, control lines 1G, and a bidirectional data bus 1H. Interface board 5 in turn sends and receives digital signals to and from up to four scanner boards 6, causing the logic circuitry thereon to determine the status of up to 64 sensors 10 for each scanner board 6, for a maximum of 256 sensors. The digital signals sent from the computer 1 through the interface board 5 to the scanner boards 6 select, in a manner described later in detail, which of the 256 possible sensors 10 is being interrogated. Each sensor 10 is a switch, a relay contact or some other device having a pair of contacts which are either open or closed, and after sensing it the associated scanner board sends an electrical signal which is a logic 0 or a logic 1 back to the computer 1 through the interface board 5 to indicate whether the contacts are open or closed. The program in the computer 1 then compares the status of each sensor with its desired status, which is specified by the user when the system is installed. Any discrepancy between the status of a given sensor and its desired status is interpreted by the program as an indication of an alarm condition.

The interface board 5 is also connected to a conventional citizens band (CB) radio transceiver 12, for example a Radio Shack TRC-422A, thereby permitting the security and alarm system to communicate with other identical systems using radio waves. The information signals passed between the interface board 5 and the transceiver 12 are audio frequency analog signals in the 300–3000 Hz range. The transceiver 12 is normally kept in receive mode.

If the security and alarm system has detected an alarm condition via its sensors 10, it will send digital control signals to its radio transceiver 12 in order to place the transceiver 12 into transmit mode. The computer 1 has a table of numbers therein which correspond to various amplitudes at equally spaced intervals along a sinusoidal waveform. This digital data is sent sequentially at a rate proportional to a desired frequency to interface board 5, where it is converted to analog form, filtered, and attenuated to produce a digitally synthesized sinusoid of precise frequency in the 300–3000 Hz frequency range. The frequency of the signal can be changed by changing the rate at which data from the table is transmitted. This audio frequency signal is used as an input signal by transceiver 12. Since transceiver 12 is in the transmit mode, modulated radio frequency emissions will be radiated by antenna 13 and can be received by any other such transceiver within a range of approximately five miles. Other security and alarm systems, which it is assumed are in the receive mode (since the probability of alarm conditions occurring simultaneously at two or more locations is extremely small), will receive the radio frequency emissions produced by the transmitting system. The audio output of the transceiver is filtered and converted into a digital signal by a frequency-to-binary converter circuit on the interface board (which circuit will be described in detail later). This digital signal is passed by the interface board 5 to the computer 1, where it is compared to the type of signal that would be received if alarm data were being transmitted by another system. Normally, no alarm condition is being detected by any such system, and the pattern of 1's and 0 's received by the computer will be a random pattern caused by noise or by normal use of the CB channel by other people. In such a case, the pattern of 1's and 0's will not have the specific coding that coded alarm signals generated according to the invention would have. Consequently, the computer 1 simply ignores them. However, when an alarm condition is being signaled by one of the systems, the received patterns will "match" the data pattern expected in the event of an alarm condition and the video display 1C of the computer 1 is then used to display the transmitted message. This message will normally contain the location of the transmitting station, pertinent telephone numbers (e.g., the police), and other such data which the owner of the transmitting station has given it to transmit. Simultaneously, at both the transmitting system and all receiving systems, the computer 1 will cause an interface board 5 to activate one or more audible alarms 14 to alert the occupants of the dwelling in which the alarm condition was detected and the occupants of the dwellings in which the alarm indication is now being received that an alarm condition has been detected. Sufficient information will appear on the displays of the receiving systems to allow anyone receiving an alarm indication to take appropriate action. Such action could be of a variety of forms, depending on the time of day, the type of alarm condition signaled, proximity to the dwelling in which the alarm condition was detected, and other factors. Interface board 5 can also produce an output which activates a conventional automatic telephone dialing device 15, so that the originating system (that is, the one at which the alarm condition was detected) can automatically dial a telephone number of the owner's choice to transmit the alarm condition via telephone lines as well as via the radio link which is the main form of communication.

The system as a whole is powered by a conventional and not illustrated power source, which might be a source of alternating current such as conventional 115, volt, 60 Hz electrical power supply or might be a battery back-up system allowing extended intervals of system operation in the event of a power failure due to natural causes or deliberately introduced by someone seeking unlawful entry.

Figure 2B:
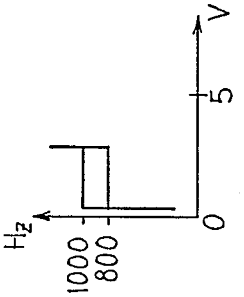
FIGS. 2A and 2B are graphs showing hysteresis characteristics of respective portions of the frequency-to-binary converter circuit of FIG. 2.
Figure 2A:
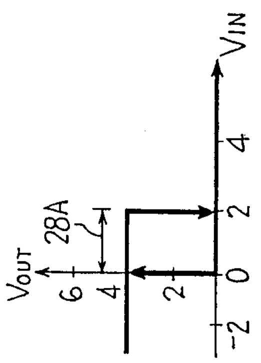
Figure 2:
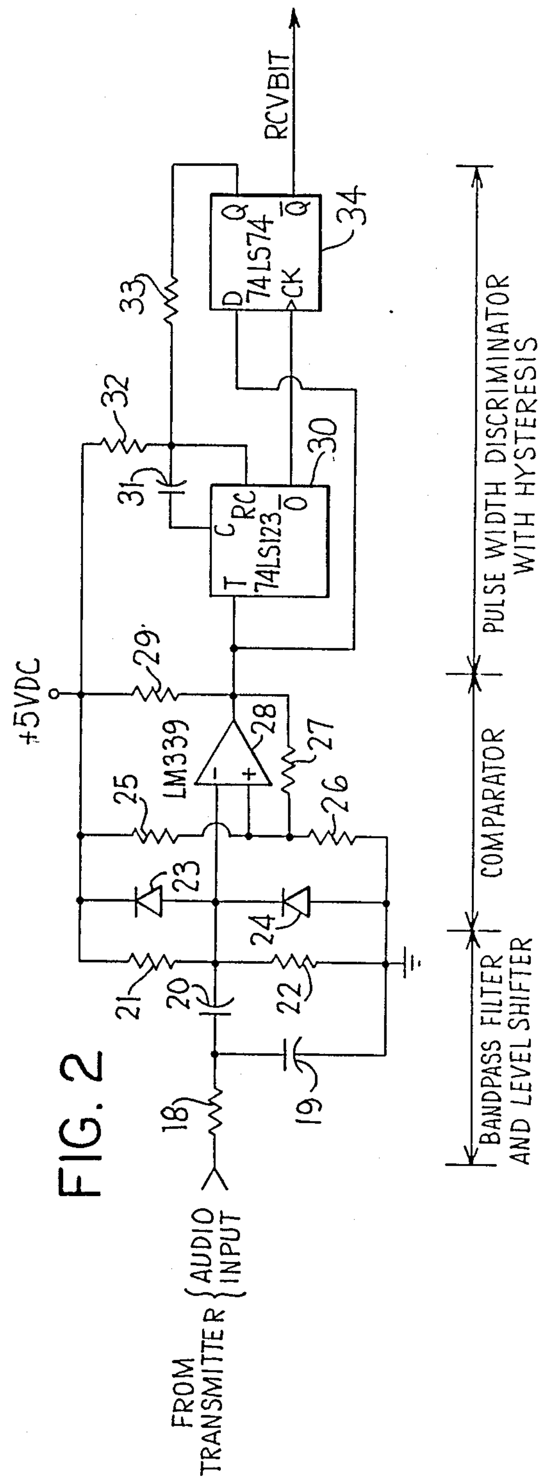
FIG. 2 is a schematic circuit diagram of a frequency-to-binary converter circuit which is a portion of the circuitry of an interface board which is a component of the system of FIG. 1.

Referring now to FIG. 2, there is shown a circuit diagram of a frequency-to-binary converter, which accepts as an input the audio frequency output of the radio transceiver 12 and converts it into a digital signal (l's and 0 's) suitable for processing by the computer 1. The audio input is obtained from the speaker output of radio transceiver 12, and is passed through an audio frequency filter consisting of resistors 18, 21 and 22 and capacitors 19 and 20. Resistor 18 and capacitor 19 form a low pass filter whose function is to remove extraneous hiss, static, and other forms of high frequency noise from the audio signal. Capacitor 20 and resistors 21 and 22 form a high pass filter whose function is to remove extraneous low frequency noise (generated largely by speech waveshapes) from the signal. Resistors 21 and 22 also form a voltage divider across the power supply in order to set the proper bias voltage at the inverting input of a comparator 28. Diodes 23 and 24 serve to prevent the input voltage to the inverting input of comparator 28 from going substantially above 5 volts or substantially below ground, since either condition will cause comparator 28 to generate spurious outputs unrelated to its intended function. Resistors 25, 26 and 27 serve two functions simultaneously. First, they set the bias voltage at the non-inverting input of comparator 28 to a level compatible with that set by resistors 21 and 22 at the inverting input. Second, mediated primarily by resistor 27, they provide positive feedback from the output of comparator 28 to its non-inverting input, thus causing the transfer characteristic of comparator 28 and its associated circuitry to exhibit a controlled amount of hysteresis, as shown in FIG. 2A, which causes comparator 28 to discriminate against noisy input signals based on their amplitude (whereas the filters referred to previously discriminate against noisy input signals based on frequency). Resistor 29 is a pull-up resistor for comparator 28, and plays a relatively minor role in the determination of the hysteresis width (at 28A in FIG. 2A) of comparator 28 and the bias level at the non-inverting input of comparator 28. As evident from FIG. 2A, the output of comparator 28 is a digital signal which is approximately 3.5 volts (logical 1) whenever the audio input is positive and is approximately 0 volts (logical 0) whenever the input audio signal is negative. Thus, the main function of the circuitry of FIG. 2, up to the output of comparator 28, is to convert the audio input signal (which may be thought of as a sinusoidal input signal at a given frequency) into a digital signal (a squarewave signal) having the same frequency as the sinusoidal audio input signal. In other words, it is a sine wave to square wave converter, albeit with carefully tailored filtering properties.

The digital output of comparator 28 is fed into the trigger input T of a monostable multivibrator 30 and into the data input D of positive edge-triggered D type flip-flop 34. The width of the output pulse produced at the $\overline{Q}$ output of monostable multivibrator 30 is determined primarily by resistor 32 and capacitor 31, but resistor 33 also plays an important role in determining the width of the output pulse, as described below. The $\overline{Q}$ output of monostable multivibrator 30 is used to clock D flip-flop 34. Thus, since the $\overline{Q}$ output of the monostable multivibrator 30 inherently produces a negative pulse, or in other words a pulse having a decreasing voltage at its leading edge and a rising voltage at its trailing edge, and since the flip-flop 34 is positive edge-triggered, or in other words accepts data at a point in time when the voltage at the clock input is rising, the flip-flop 34 is clocked by the trailing edge of the negative pulse from the multivibrator 30. Ignoring the effect of resistor 33 temporarily, the combination of monostable multivibrator 30, its associated circuitry, and D flip-flop 34 constitute a pulse-width frequency discriminator which produces a digital output signal RCVBIT which is high (logic 1) if the frequency of the incoming square wave from comparator 28 is greater than 1000 Hz and is low (logic 0) if the frequency of the incoming square wave from comparator is less than 1000 Hz. Thus, monostable multivibrator 30, D flip-flop 34, and the associated circuitry can detect whether or not the frequency of the square wave out of comparator 28 is above or below a threshold frequency of 1000 Hz. The threshold frequency is, of course, controlled by the width of the output pulse generated by monostable multivibrator 30, which in turn is determined by the values of resistors 32 and 33, capacitor 31, and the output voltage level at the Q output of D flip-flop 34. Since the frequency of the square wave out of comparator 28 is essentially equal to the frequency of the incoming audio signal, RCVBIT is high (logic 1) if the frequency of the incoming audio signal is greater than 1000 Hz, and RCVBIT is low (logic 0) if the frequency of the incoming audio signal is less than 1000 Hz.

The binary digits of the coded transmissions from a system at which an alarm condition has been detected are transmitted serially as digitally synthesized sinusoidal signals where, for example, 1200 Hz represents a binary 1 and 600 Hz represents a binary 0. The overall function of the circuitry of FIG. 2 is to serially reproduce the transmitted pattern of 1's and 0's for subsequent analysis by the computer 1.

Since transitions from 600 Hz to 1200 Hz and back are noisy, spurious outputs from the circuit could result as the input frequency is changed. To avoid this, the pulse-width discriminator which includes monostable multivibrator 30, D flip-flop 34, resistor 32, and capacitor 31 is given a transfer characteristic having a certain amount of hysteresis. FIG. 2B is a graph of the output voltage at RCVBIT as a function of the frequency of the output signal from comparator 28. Resistor 33 produces a small, controlled amount of positive feedback, as follows. If RCVBIT is high, signifying that the input frequency is greater than 1000 Hz, the Q output of D flip-flop 34 is low, and resistors 32 and 33 form a voltage divider across the power supply, thereby lowering the voltage available for charging capacitor 31. This increases the pulse width of the monostable multivibrator 30 and thus lowers the threshold frequency of the pulse-width discriminator to approximately 800 Hz. On the other hand, if RCVBIT is low, signifying that the input frequency is less than the threshold frequency of the pulse width discriminator, the Q output of the D flip-flop will be high, and resistors 32 and 33 will both be connecting capacitor 31 to approximately 4 to 5 volts, so that the capacitor 31 is charged in a manner producing a pulse width for the monostable multivibrator 30 which corresponds to a threshold frequency of 1000 Hz. In effect, resistor 33 causes the pulse-width discriminator to have two threshold frequencies, the higher one being in effect if the input frequency is low, and the lower one being in effect if the input frequency is high. This produces hysteresis which discriminates against noise in the input frequency.

The frequency-to-binary converter of FIG. 2, although containing a relatively small number of parts, is thus seen to be to perform a multiplicity of functions, and the careful attention paid to noise reduction in every available way should be apparent. The performance of this circuit is important to the performance of the system as a whole.

Figure 3:
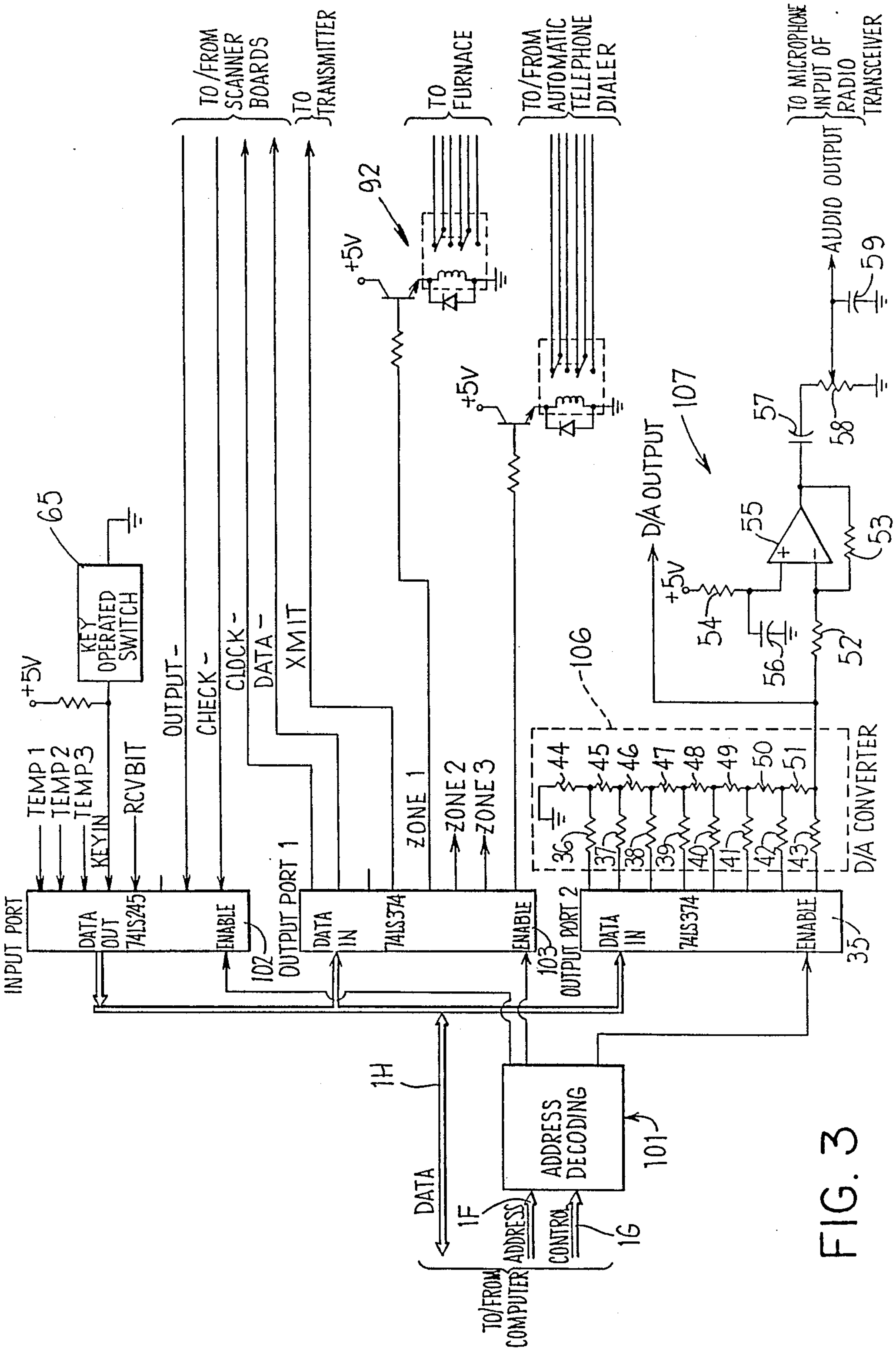
FIG. 3 is a schematic circuit diagram of a further portion of the circuitry of the interface board of FIG. 1, including input and output ports and a digital-to-analog converter circuit.

FIG. 3 is a schematic diagram of a portion of the circuit of the interface board 5 of FIG. 1. The bidirectional data bus 1H from the computer 1 is connected to an octal buffer 102 which serves an input port and to two octal latches 103 and 35 which serve as output ports 1 and 2, respectively. The address and control lines 1F and 1G from the computer 1 are connected to a conventional address decoding circuit 101 which in turn is connected to enable inputs of the buffer 102 and the octal latches 103 and 35. When the address decoding circuit 101 determines that the computer 1 is addressing the input port, it sends an enable signal to the buffer 102 which causes the buffer 102 to place onto the respective lines of the 8-bit data bus the digital signals present at its eight data inputs. Similarly, when the address decoding circuit 101 determines that the computer 1 is addressing one of the latches 103 and 35, it sends an enable signal to the selected latch which causes that latch to be loaded with the data placed on the bidirectional data bus by the computer 1. This information is then available at the data outputs of that latch until the latch is again loaded.

FIG. 3 also shows a digital-to-analog converter 106, together with an output buffer amplifier 107. The digital-to-analog converter 106 includes eight resistors 36–43 and eight resistors 44–51. The resistors 44–51 are connected in series and one end of this serial arrangement is connected to ground, and the resistors 36–43 each connect a respective output of the octal latch 35 to a respective node in the serial arrangement of resistors 44–51. This arrangement is called an R-2R ladder because resistors 36–43 have twice the resistance of resistors 44–51. It is well known that the DC output voltage at the point labeled D/A OUTPUT is proportional to the digital number in the octal latch 35, where the least significant bit of the digital number corresponds to resistor 36 and the most significant bit corresponds to resistor 43. The D/A OUTPUT is a relatively large signal, and this high-level signal is used as an audio input to the transceiver 12 and also as a comparison voltage for analog-to-digital conversion of analog signals from one or more temperature sensors which can be used to detect a low or high temperature alarm condition and can also be used as part of an energy management system. The D/A OUTPUT signal is sent to a buffer amplifier 107 which includes resistors 52, 53, 54 and 55, current-mode operational amplifier 55, and capacitor 56. The output voltage of operational amplifier 55 is connected through a DC blocking capacitor 57 to a potentiometer 58, which permits the amplitude of the AUDIO OUTPUT signal from the buffer amplifier 107 to be adjustably attenuated to the small voltage level necessary for applying it to the microphone input of radio transceiver 12 (FIG. 1). Since the output voltage D/A OUTPUT of the R-2R ladder varies in small steps, capacitor 59 and potentiometer 58 serve as a low pass filter whose cutoff frequency is selected to smooth out the step changes in the digitally synthesized waveform so that they do not get into the microphone input of the transceiver 12.

The low-level AUDIO OUTPUT signal is transmitted by the transceiver 12 when the transceiver 12 is in the transmit mode. The computer 1 feeds digital numbers which are proportional to respective amplitude values at equally spaced intervals along a sinusoid to output latch 35 at a rate suitable to generate one complete cycle every 0.00167 seconds (if a transmitted audio tone frequency of 600 Hz is desired) or every 0.000833 seconds (if a transmitted audio tone frequency of 1200 Hz is desired). The AUDIO OUTPUT signal from potentiometer 58 is the digitally synthesized sinusoid of precisely determined frequency referred to previously. Obviously, the hardware can be used to generate other types of audible (and sub-audible and ultrasonic) signals as well. In particular, digitally synthesized music, alarm tones of any desired pattern of pitch and/or intensity, and digitally synthesized speech signals can also be produced by this circuitry.

Figure 4:
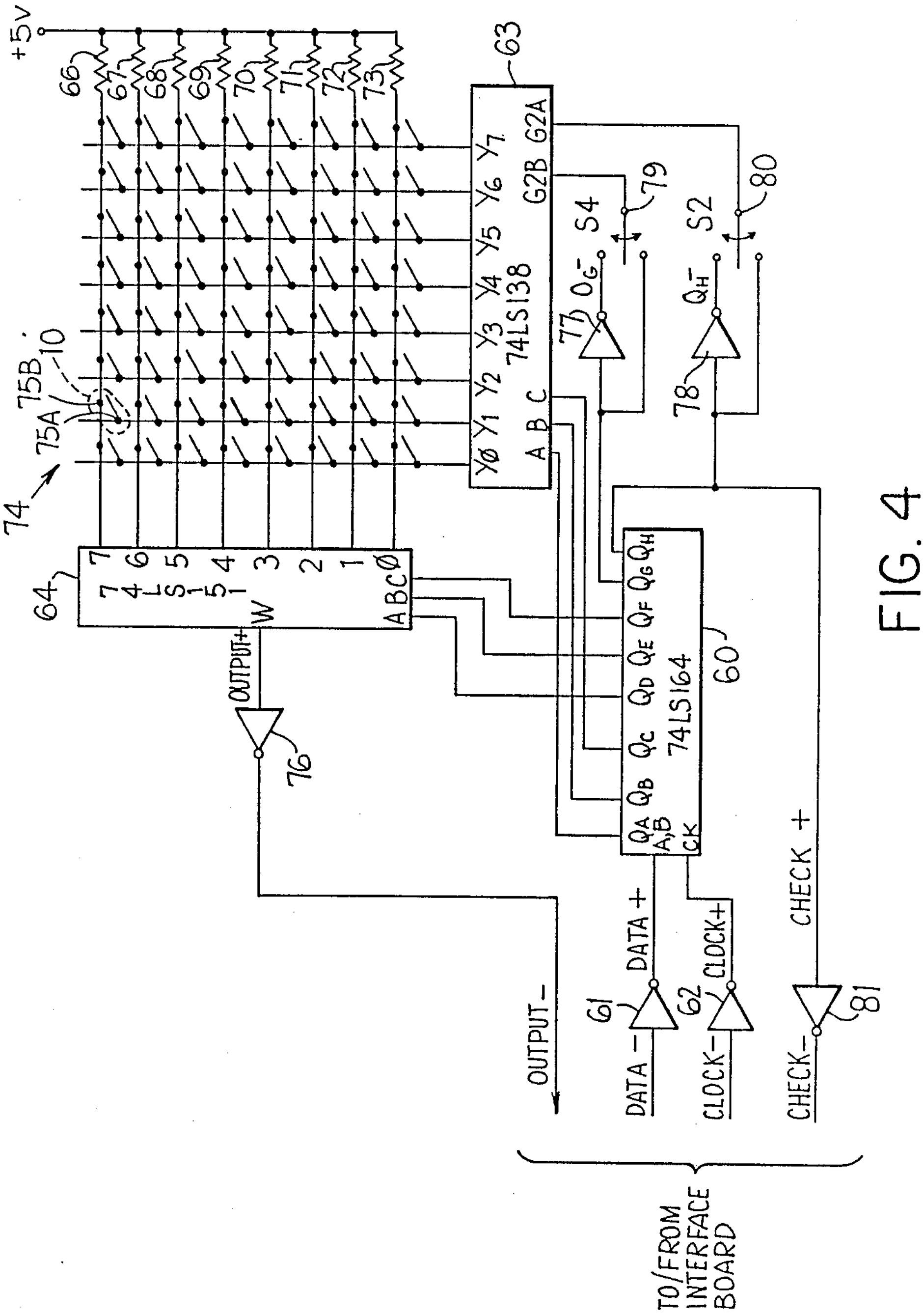
FIG. 4 is a schematic circuit diagram of a scanner board which is a component of the system of FIG. 1.

FIG. 4 shows a sensor scanner circuit which permits the computer 1 to selectively determine the status (contacts open or closed) of any of up to sixty-four of the sensors 10. Through the octal latch 103 (FIG. 3), the computer places a bit (logic 1 or logic 0) on the line in FIG. 4 named DATA-. This signal is inverted by a digital inverter 61, and serves as the serial data input to a shift register 60. Via the octal latch 103, the computer then briefly lowers the line CLOCK-, which is inverted by an inverter 62, thereby clocking the shift register 60, causing all data therein to be shifted and the input data on the line DATA+ to be loaded into the first flip-flop of shift register 60. This sequence is repeated eight times in a row, with a different value being output by the computer on the DATA- line each time. In this way, the computer 1 can, under program control, load shift register 60 with any desired 8-bit number. In the disclosed security system, the number is a sensor address from 0 to 255. The left-most three bits of the shift register are connected to the select bits A, B, C of a three-to-eight decoder 63, causing the corresponding one of the eight output lines Y0–Y7 to go low (logic 0), while all other output lines of the decoder will remain high (logic 1). The second three bits of the shift register 60 are connected to the select bits A, B, C of an eight-to-one data selector 64, causing the corresponding one of the eight input lines to be transferred through the data selector 64 to its output.

Normally, each data input line of the selector 64 is held high (logic 1) by a corresponding one of eight resistors 66–73 which are each connected to +5 v. However, the contacts of each sensor 10 are respectively connected to a respective row and a respective column of an array 74 of sixteen wires, eight of which are connected to the eight outputs of decoder 63 and eight of which are connected to the eight inputs of data selector 64. There are no direct electrical connections between any of these 16 wires. If the contacts 75A and 75B of a selected sensor 10 are open, the corresponding wires are not connected and the corresponding input line to data selector 64 will remain high (logic 1). On the other hand, if the sensor contacts 75A and 75B are closed, the corresponding output Y1 of decoder 63 will be connected to input 7 of data selector 64 by the engagement of contacts 75A and 75B. Thus, for example, when select inputs A, B, C of decoder 63 have the values 001 (binary 1), Y1 will go low (logic 0), and when select inputs A, B, C of data selector 64 have the values 111 (binary 7), the low output on Y1 will be coupled to input 7 of data selector 64 by the short between contacts 75A and 75B and will appear at the output W of data selector 64. Thus, output W will be high if there is no connection between contacts 75A and 75B, and will be low if there is a connection therebetween. Changes in the state of the sensor contacts 75A and 75B can therefore be detected. Output W is inverted and sent back to the computer 1 as digital signal OUTPUT- via octal input port 102.

Contacts 75A and 75B have been used only as an example in the foregoing discussion. By controlling the bit pattern in shift register 60, the computer 1 can sequentially interrogate all 64 of the sensors 10 and determine if any of the eight horizontal wires have been connected to any of the eight vertical wires.

The last two bits of shift register 60 are connected to switches 79 and 80 so that either $Q_G$ or $Q_G$— or $Q_H$ or $Q_H$— may be selected as inputs to the enable inputs G2B and G2A of decoder 63. The eight bits held by shift register 60 are sufficient to address 256 sensors, but the basic scanner circuit of FIG. 4 handles only 64. Setting switches 79 and 80 to any one of their four possible combinations of settings determines which one of the four groups of 64 sensors that are contained in the 256 possibilities will cause a given one of four scanner boards 6 to respond: 0–63, 64–127, 128–191, or 192–255. Four scanner boards 6 having their switches 79 and 80 set to respective positional combinations may thus be used simultaneously in a given system. Consequently, up to 256 different sensors may be handled by the system. All data lines out of the scanner boards, such as OUTPUT— and CHECK— are driven by open collector inverters as at 76 and 81 so that all scanner boards 6 can be connected to the interface board 5 through a common cable. Normally, the computer 1 interrogates the status of each of the sensors 10 in ascending or descending order, but this is merely a programming convenience; the sensor scanner circuit of FIG. 4 allows sensors to be interrogated in any order, including random and/or repeated interrogations of the same sensor for validation purposes if that is desired.

A certain amount of self-diagnostic capability is included in the circuit of FIG. 4. The eighth bit of shift register 60 is fed back as output CHECK— from each scanner board 6 to the computer 1 via open collector inverter 81. As a result, computer 1 can feed known test patterns serially through each shift register 60 and verify that the desired pattern did indeed get into shift register 60. A substantial amount of the more troublesome parts of the system, for example the interconnecting cables, can be at least partially checked this way.

The occupant of the dwelling in which the system is installed must be able to get back into the dwelling without causing the security system to set off an alarm. Accordingly, as shown in FIG. 3, a key-operated switch 65 which is operable from outside the dwelling is connected to an input of the input port 102. The occupant uses a key to deactuate this switch before entering the dwelling. When the normal scanning of the sensors 10 indicates that a change in state of one of these sensors has occurred, namely that one of the doors has been opened as the occupant enters, the system immediately checks to see whether the key-operated switch 65 has been deactuated. If so, no alarm is given. If not, then an alarm is issued.

Figure 5:
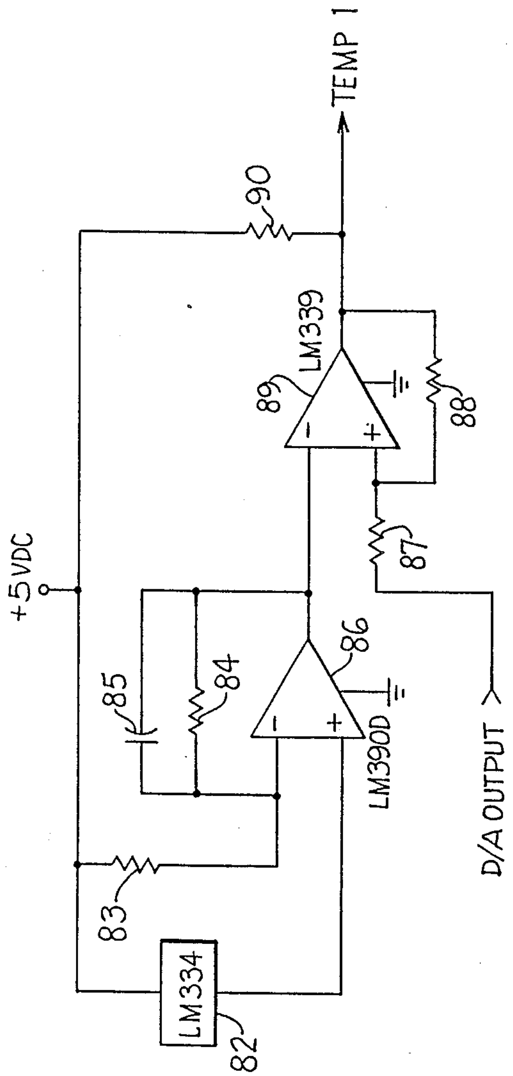
FIG. 5 is a schematic circuit diagram of a temperature sensor and comparator circuit which is a further portion of the interface board of the system of FIG. 1.

The occupant must also be able to get out of the dwelling without setting off an alarm. In the preferred embodiment, the occupant pushes a predetermined key on the keyboard 1D (FIG. 1), and the system then gives the occupant about four minutes and 15 seconds to leave the house and close any doors. Alternatively, the system could simply wait until the key switch 65 is reactivated by the occupant after leaving the dwelling FIG. 5 illustrates a further portion of the circuitry on the interface board 5, namely, a temperature sensor and temperature comparator circuit. A basic component of this circuit is a conventional and commercially available device 82 whose output current is proportional to absolute temperature. Resistor 83 supplies an input current to the inverting input of a current mode operational amplifier 86. Operational amplifier 86 and resistor 84 function as a current differencing amplifier, producing an output voltage proportional to temperature on a Centigrade or Fahrenheit scale, rather than on an absolute temperature scale. The linear output voltage range of operational amplifier 86 may thereby be made to occur over a selected temperature range, for example from the freezing point of water to the boiling point of water, rather than from absolute zero to room temperature. Capacitor 85 slows down the response of operational amplifier 86 so that small random variations in instantaneous temperature of the device 82, such as may be caused by wind or convection currents in the air, do not cause significant changes in the output voltage of operational amplifier 86. Operational amplifier 86 thus functions as a low pass filter as well as a differential amplifier. The output voltage of operational amplifier 86 is compared by a comparator circuit, which includes comparator 89 and resistors 87, 88 and 90, with the high level output voltage obtained from the D/A converter 106 (FIG. 3). This voltage is controlled by the computer 1. TEMP1, the output voltage from comparator 89, is fed back to the computer 1 via input port 102 (FIG. 3) on interface board 5, so that the computer 1 can determine whether or not the output voltage of the digital-to-analog converter 106 is less than or greater than the output voltage of operational amplifier 86, and thus determine the temperature at the temperature sensitive device 82. The interface board 5 preferably includes three of the temperature sensing circuits shown in FIG. 5, the output D/A OUTPUT from the digital-to-analog converter being connected to each such circuit and the respective outputs TEMP1, TEMP2 and TEMP3 of these three circuits being connected to respective inputs of the input port 102, as shown in FIG. 3. The temperature sensitive devices 82 can be provided at respective locations in the dwelling which are spaced from interface board 5, and they may thus be used to measure three different indoor temperatures, and if the security and alarm system is connected to the heating plant for the dwelling, a three-zone heating system can be implemented. Alternatively, one of the devices 82 can be used to measure the outdoor temperature. The system architecture is not limited to three temperature sensors; provision of more input ports on the interface board allows the number of temperature sensing circuits to increase to almost any desired degree at relatively low cost. The digital-to-analog circuitry is shared among all temperature sensing circuits, and need not be duplicated. As shown in FIG. 3, an output ZONE1 of the output port 103 is connected through a resistor and transistor to a relay 92 which can control a furnace capable of supplying heat to the portion of the dwelling in which the temperature sensitive device 82 (FIG. 5) is located. Two additional outputs ZONE2 and ZONE3 are preferably connected through similar relays to two additional furnaces which can respectively supply heat to the portions of the dwelling having the temperature sensitive devices which are connected to the inputs TEMP2 and TEMP3 of input port 102.

The three furnaces are controlled independently in the preferred embodiment, and the manner in which one such furnace is controlled will now be described. The occupant of the dwelling provides the system with data which specifies the desired temperature in the region of the temperature sensitive device 82 at various times during the course of a day. This data is stored in the memory 1B. In order to measure the actual temperature in the region of the temperature sensitive device 82, the system sends to output port 35 (FIG. 3) a digital number which the system estimates to be the actual temperature. This digital number is converted to an analog voltage by the D/A converter 106, and the comparator 89 in FIG. 5 compares this analog signal to an analog signal from the operational amplifier 86 which represents the actual temperature at the temperature sensitive device 82. The result of the comparison is a digital signal (TEMP1) at the output of comparator 89 which is high if the actual temperature is higher than the estimated temperature and low if the actual temperature is lower than the estimated temperature. The system reads the TEMP1 signal through input port 102, and then increments or decrements its temperature estimate, based on the state of TEMP1, in order to bring the temperature estimate closer to the actual temperature. The system repeats this sequence several times, each time using its most recent revision of the estimated temperature, and in due course the estimated temperature will substantially conform to the actual temperature. Using this approach to measure the actual temperature takes longer than would be required if a dedicated analog-to-digital converter were provided to convert the analog output of the temperature sensitive device 82 into a digital number, but the slowness is preferable because it filters out small temporary fluctuations in the output signal from the temperature sensitive device 82, for example those caused by air turbulence, and has the additional advantage of avoiding the cost of a dedicated analog-to-digital converter.

After the system has measured the actual temperature in the manner just described, it locates the temperature which the dwelling occupant has previously specified for the current time of day, and compares this specified temperature to the measured temperature. If the measured temperature is above the specified value, the system deactuates the relay 92 (FIG. 3), which will turn the associated furnace off if it is on and will keep it off if it is already off. On the other hand, if the measured temperature is below the specified temperature, the system actuates the relay 92 in order to cause the associated furnace to supply heat to the region of the temperature sensitive device 82.

The occupant of the dwelling can provide the system with a separate time/temperature profile for each additional temperature sensitive device, and the system independently controls the furnace associated with each such temperature sensitive device in a manner analogous to that just described. Instead of providing separate furnaces, it would alternatively be possible to provide a single furnace and to selectively actuate valves which control fluid flow through conduits which carry heat from the furnace to the region of each of the respective temperature sensitive devices. Further, the system could control one or more air conditioning systems in a manner analogous to that described above for heating systems.

Figure 6:
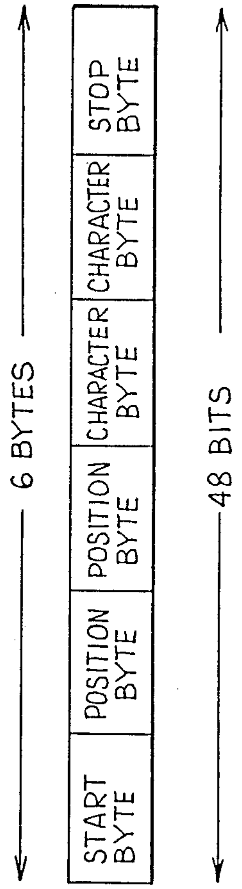
FIG. 6 is a diagram of a coded data format used in inter-system data transfer in the system of FIG. 1.

With respect to the drawing of FIG. 6, there is shown a coded data format according to the invention which is used to transmit data from one system to another. The data to be transmitted is referred to as a message. There are two important characteristics about any message: the characters (letters, numbers, spaces, punctuation marks, etc.) which it includes and the sequence in which the characters occur. Wrong characters obviously constitute a garbled message, but correct characters in erroneous sequence are equally disastrous. The coded format in FIG. 6 is based on a number pair. The first number, in the range of 0–255, is simply the 8-bit ASCII code for a particular character. The character's position within the message is given by the second number. Each message in the system of FIG. 1 can include up to 128 characters. Consequently, 7 bits are required to define the position of a given character, and the number pair is thus a 2-byte quantity. (A byte is 8 bits).

The effects of noise and/or jamming signals can cause a properly transmitted character to be received incorrectly; the character byte may be incorrect, the position byte may be incorrect, or both may be incorrect. All three situations are equally undesirable. Therefore, it is desirable to include some form of verification that a byte received, whether a character byte or a position byte, is indeed correct before it is output to the receiving system's display screen. According to the invention, and as shown in FIG. 6, the position byte is sent twice, and then the character byte is sent twice. Obviously, a greater number of repetitions could be used, reducing the probability of accepting an invalid character/position pair to as low a level as desired.

If a long string of such numbers is transmitted, it is difficult to know where the beginning of the first data byte is. This is referred to as the synchronization problem. In the coded data format in FIG. 6, the two identical position bytes are therefore preceded by a start byte of all binary 0 's (00000000) and the two identical data bytes are followed by a stop byte of all binary 1's (11111111). The coded format used to transmit one character is thus six bytes or 48 bits in length: a start byte, two identical bytes for redundant transmission of the character position byte, two identical bytes for redundant transmission of the character itself, and a stop byte. As an example, sending the message "CAT" would require transmission of the following three 48--bit strings:

000000000000000000000000001000011010000011111111-111

00000000000000010000000101000000101111111111-11111

0000000000000001001010101000101010011111111

The ASCII codes for C, A, and T are C =0100011, A=01000001, and T=01010100, and they are respectively the 0000000000,0000000001, and 0000000010 characters in the message.

The three 48-bit strings above are repeated below, with spaces inserted between bytes in order to make the example easier to understand:

| START | POSITION | POSITION | CHAR | CHAR | STOP |
|---|---|---|---|---|---|
| 00000000 | 00000000 | 00000000 | 01000011 | 01000011 | 11111111 |
| 00000000 | 00000001 | 00000001 | 01000001 | 01000001 | 11111111 |
| 00000000 | 00000010 | 00000010 | 01010100 | 01010100 | 11111111 |

Translated into conventional letters and decimal numbers, this reads:

| | |
|---|---|
| 0 0 0 C C | 255 |
| 0 1 1 A A | 255 |
| 0 2 2 T T | 255 |

A serially received string of 48 bits may or may not represent a valid 6-byte transmission from another security and monitoring system. To be valid:

(a) the first byte must be 00000000;

(b) the sixth byte must be 11111111;

(c) the second and third bytes must be identical;

(d) the common binary value of the second and third bytes must be between 0 and 01111111 (decimal 127);

(e) the fourth and fifth bytes must be identical; and (f) the common binary value of the fourth and fifth bytes must lie between 00100000 (decimal 32) and 01011010 (decimal 90) inclusive, which includes the ASCII codes for all the capital letters, all commonly used punctuation marks, and the decimal digits 0–9.

Figure 7:
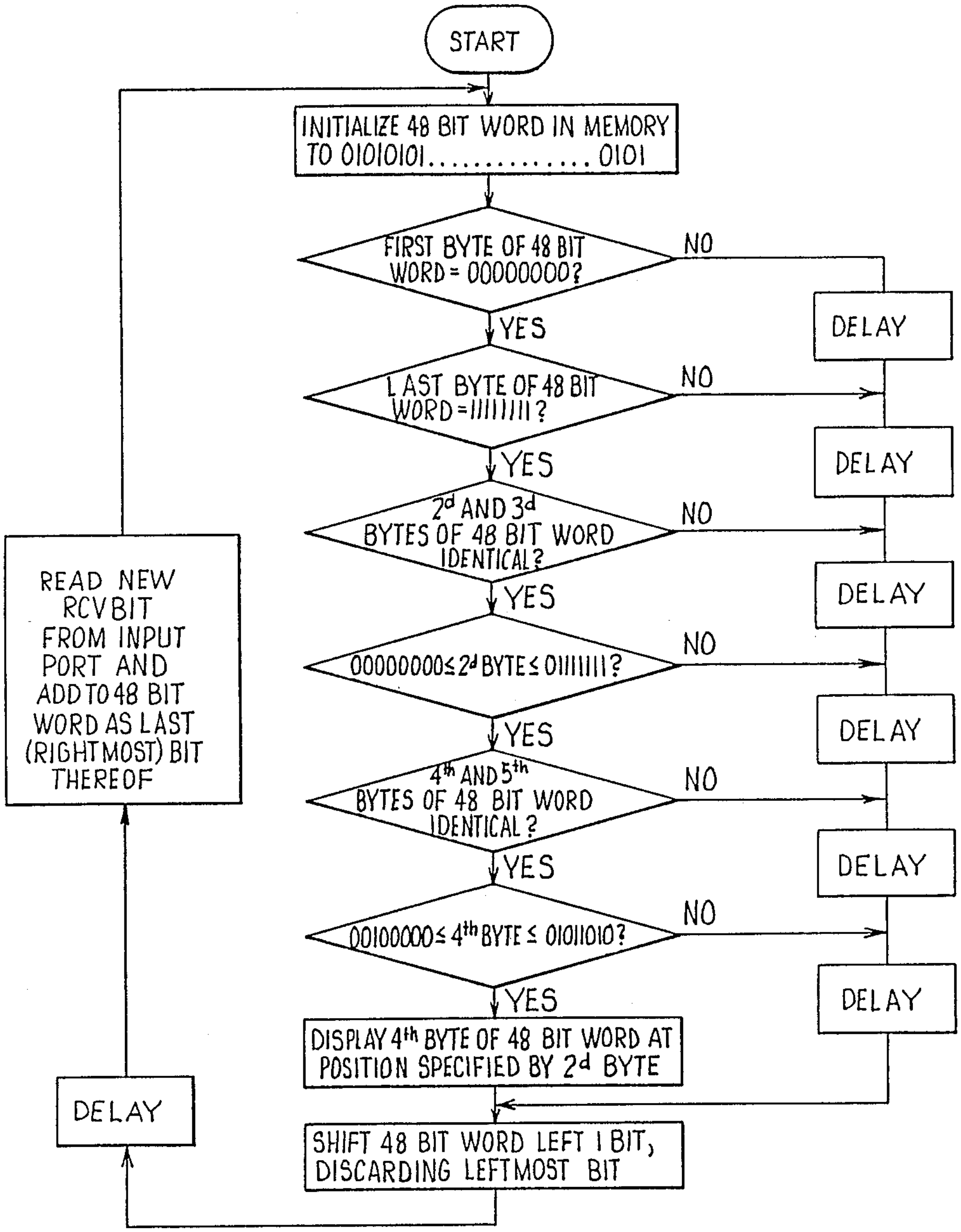
FIG. 7 is a flowchart of a pattern recognition sequence used to analyze received data.

Thus, according to the invention, a serially received 48-bit word is treated as a valid transmission only if several important conditions are met. Special purpose hardware to check these conditions could be designed without difficulty, but they can also be checked quite rapidly by the computer 1 using a suitable sequence of compares and/or subtractions. FIG. 7 is a flowchart of the sequence of steps the computer 1 preferably follows to check these conditions. Assuming that all the tests have been passed and the 48-bit word is indeed valid, the receiving computer 1 will then display the character specified in the second byte at one of 128 positions on its display screen specified by the fourth byte. If, on the other hand, the 48-bit word does not meet all of the requisite conditions, the 48-bit word being analyzed does not represent a valid transmission and it is not displayed. Instead, it is simply ignored.

In either case, whether the data is valid or not, the receiving computer 1 shifts the resulting 48-bit word of FIG. 6 left one bit, discarding the leftmost (oldest) bit, and then reads a new bit from the RCVBIT (FIG. 2) through the input port 102 and adds it to the 48-bit word as the rightmost bit. In essence, a 48-bit shift register is implemented in the memory of the computer 1, and each time a new bit is received the 48-bit word is shifted 1 bit and is then examined in detail again to see if it is a valid transmission from another system. If it is, it is displayed. If it is not, it is ignored.

There is no practical way to achieve absolute synchronization of the transmitting and receiving systems at the bit level. Therefore, it is entirely possible that a receiving system may be sampling received information at precisely the instants in time that the transmitting system is changing the bits it is sending. In such a case, valid data would be received very rarely, if at all. Preferably, the receiving system samples received information halfway between changes made by the transmitting system. In this case, highly accurate and consistent data transmission is normally achieved. If the transmitting and receiving rates are very nearly equal, very long periods of satisfactory reception can occur, but long periods of little or no reception can also occur. This is undesirable. It is therefore preferable that the transmitting and receiving bit rates differ in frequency by an amount so that simultaneous changing and sampling of data bits will occur periodically but for only short periods of time, no greater than the time required to transmit a 128-character message once. The sampling rate of the receiving system can, for example, be adjusted by varying the length of the delays shown in the flowchart of FIG. 7. The system may miss part of one transmission of the message, but it will receive the message correctly the next time it is transmitted.

It might be supposed that the 128 character positions referred to above are sequential positions on the screen of the displaying microcomputer. This need not be the case; in the system described here, the positions can be provided in groups at various locations on the screen. The data entry routines used when the system user enters his personal data into his system assign position numbers to his input characters in such a way that when these position numbers are received and transformed through the inverse function. The received characters are displayed in the same locations on the video display of the receiving system as the locations they were assigned upon entry into the transmitting system. Thus, the display format is substantially the same as the data entry format, allowing each user to exert considerable control over what will appear on the video display of all receiving systems in the event an alarm condition is detected at his location.

The coded data format illustrated in FIG. 6 and described above has been found to be very effective at avoiding false alarms. In the presence of interfering signals, the transmitting system is of course unaware that interference is taking place. It simply repeats the message a number of times. The receiving system receives valid data in the frequent lulls in the interfering signals, such lulls being very common with voice-generated interference, and ignores invalid data produced as a result of the interfering signals. Since position data accompanies and has equal status with the character data, the receiving system does not lose its place in the message. Missing characters are simply filled in and/or corrected on the next transmission of the message. Furthermore, if no station is transmitting valid message data, naturally occurring noise and interference never cause the receiving system to receive and display a valid message. Consequently, the system as a whole has an extremely low probability of false alarms.

Although a particular preferred embodiment of the invention has been disclosed in detail for illustrative purposes, it will be recognized that variations or modifications of the disclosed apparatus, including the rearrangement of parts, lie within the scope of the present invention.

PROGRAM LISTING

The foregoing description of the security and alarm system according to the invention should be sufficient to permit a programmer of ordinary skill to generate the program required for the computer 1 shown in FIG. 1. Nevertheless, in order to ensure that a functional version of the program is readily available, an exemplary version of the program is set forth hereinafter.

The embodiments of the invention in which an exclusive property or privilege is claimed are defined as follows:

1. A pulse width discriminator circuit, comprising: a D-type flip-flop having a data input, a clock input, a data output, and an inverted data output; a retriggerable monostable multivibrator having a trigger input, an external capacitance input, an external resistance-capacitance input, and an inverted data output; a capacitor; and first and second resistors; wherein said first resistor has one end connected to a source of power and its other end connected to said external resistance-capacitance input of said monostable multivibrator; wherein said capacitor has one end connected to said external capacitance input of said monostable multivibrator, and its other end connected to said external resistance-capacitance input of said monostable multivibrator, wherein said second resistor has one end connected to said data output of said flip-flop and its other end connected to said external resistance-capacitance input of said monostable multivibrator; and wherein when an input signal which is approximately a square wave is applied to said trigger input of said monostable multivibrator and to said data input of said flip-flop, said flip-flop produces at said inverted data output thereof an output signal which is a logic high voltage when the frequency of said input signal has exceede a fist predetermined frequency and until the frequency of said input signal thereafter falls below a second predetermined frequency which is less than said first predetermined frequency, and which is a logic low voltage when said input signal has fallen below said second predetermined frequency and until said input signal again exceeds said first predetermined frequency.

2. A circuit having a pulse width discriminator, comprising: a D-type flip-flop having a data input, a clock input, and a data output; a monostable multivibrator having a trigger input which is connected to said data input of said flip-flop, a data output which is connected to said clock input of said flip-flop, and a pulse width control input; and pulse width control circuit means connected to said pulse width control input of said monostable multivibrator for determining the width of a pulse produced by said monostable multivibrator when an input signal applied to said trigger input actuates said monostable multivibrator, said clock input of said flip-flop being responsive to the trailing edge of each pulse from said monostable multivibrator, said pulse width control circuit means including hysteresis circuit means for causing a pulse produced by said monostable multivibrator to have a first width when said flip-flop is in a first state and to have a second width slightly greater than said first width when said flip-flop is in a second state; wherein when an AC input signal is applied to said trigger input of said monostable multivibrator, said flip-flop produces at said data output thereof an output signal which is a logic high voltage when the frequency of said input signal has exceeded a first predetermined frequency and until the frequency of said input signal thereafter falls below a second predetermined frequency which is less than said first predetermined frequency, and which is a logic low voltage when said input signal has fallen below said second predetermined frequency until said input signal again exceeds said first predetermined frequency.

3. The circuit of claim 2, wherein said pulse width control circuit means includes a circuit portion which is connected to said control input of said monostable multivibrator and to a source of power, and wherein said hysteresis circuit means includes a resistor having a first end connected to a further data output of said flip-flop and a second end connected to said circuit portion.

4. The circuit of claim 3, wherein said monostable multivibrator has a further pulse width control input; wherein said circuit portion is connected to said further pulse width control input, includes a capacitor having two ends respectively connected to said first-mentioned and further pulse width control inputs, and includes a resistor having one end connected to said first-mentioned pulse width control input and a further end connected to said source of power; and wherein said second end of said resistor of said hysteresis circuit means is connected to said first-mentioned pulse width control input.

5. The circuit of claim 2, including a radio receiver having an output, wherein said trigger input of said monostable multivibrator is connected to said output of said radio receiver.

6. The circuit of claim 5, including: plural sensors which are each adapted to detect an alarm condition; means for monitoring said sensors to determine whether or not any said sensor has detected an alarm condition; radio transmitting means for transmitting in response to detection of an alarm condition by any said sensor a radio signal which includes a message identifying the detected alarm condition, said radio receiver receiving said radio signal, and said message being embodied in said AC input signal produced at said output of said radio receiver; and means responsive to said data output of said flip-flop for providing one of an audio and a visual indication of the receipt of said message.

* * * * *

UNITED STATES PATENT AND TRADEMARK OFFICE

CERTIFICATE OF CORRECTION

PATENT NO. : 4 847 577

DATED : July 11, 1989

INVENTOR(S) : Roland T. GERHART et al

It is certified that error appears in the above-identified patent and that said Letters Patent is hereby corrected as shown below:

Column 16, line 52; change "exceede a fist" to ---exceeded a first---.

Signed and Sealed this

Fourteenth Day of August, 1990

*Attest:*

HARRY F. MANBECK, JR.

*Attesting Officer* *Commissioner of Patents and Trademarks*